(12) United States Patent
Albarecht et al.

(10) Patent No.: US 7,376,294 B2
(45) Date of Patent: May 20, 2008

(54) OPTOELECTRONIC COMPONENT WITH AN ADJUSTABLE OPTICAL PROPERTY AND METHOD FOR PRODUCING THE LAYER STRUCTURE

(75) Inventors: Helmut Albarecht, München (DE); Hartmut Schneider, München (DE)

(73) Assignee: Finisar Corporation, Sunnyvale, CA (US)

( * ) Notice: Subject to any disclaimer, the term of this patent is extended or adjusted under 35 U.S.C. 154(b) by 121 days.

(21) Appl. No.: 10/741,745

(22) Filed: Dec. 19, 2003

(65) Prior Publication Data

US 2005/0133694 A1 Jun. 23, 2005

(51) Int. Cl.
*G02B 6/00* (2006.01)
*G02B 6/12* (2006.01)
*G02B 6/14* (2006.01)
*G02B 6/34* (2006.01)

(52) U.S. Cl. .............. 385/14; 385/15; 385/28; 385/37; 385/42; 385/129

(58) Field of Classification Search ............ 385/37
See application file for complete search history.

(56) References Cited

U.S. PATENT DOCUMENTS

| | | | |
|---|---|---|---|
| 5,668,047 A * | 9/1997 | Muroya | 438/31 |
| 5,940,568 A * | 8/1999 | Losch | 385/129 |
| 6,320,888 B1* | 11/2001 | Tanaka et al. | 372/32 |
| 6,323,507 B1* | 11/2001 | Yokoyama et al. | 257/79 |
| 2003/0026542 A1* | 2/2003 | Yoshikawa et al. | 385/37 |
| 2003/0086655 A1* | 5/2003 | Deacon | 385/50 |
| 2004/0105163 A1* | 6/2004 | Bryan et al. | 359/652 |

OTHER PUBLICATIONS

Takahashi et al. ("A 2.5 Gb/s, 4-Channel Multiwavelength Light Source composed of UV Written Waveguide Gratings and Laser Diodes Integrated on Si", Sep. 1997, ECOC 97, Conference Publication No. 448, IEE, 1997, pp. 355-358).*
"Fiber Gratings—Provide Keys to Future Optical Networks", Turan Erdogan, Photonics Spectra, Jan. 1998, 2 pgs.
"Integrated Optics: Design and Modeling" Reinhard März, Artech House, Boston, 1995, 10 pgs.

* cited by examiner

*Primary Examiner*—Michelle R. Connelly-Cushwa
(74) *Attorney, Agent, or Firm*—Workman Nydegger (57) ABSTRACT

The invention relates to an optoelectronic component and a method for producing it, in particular a waveguide structure, featuring at least one irradiation-sensitive structure in a layer structure of the optoelectronic component, the refractive index of the irradiation-sensitive structure being able to be permanently altered in a manner dependent on an irradiation. It is thus possible to change the properties of at least one layer, in particular of an optical waveguide, in a targeted manner by means of a simple method step.

17 Claims, 5 Drawing Sheets

OPTOELECTRONIC COMPONENT WITH AN ADJUSTABLE OPTICAL PROPERTY AND METHOD FOR PRODUCING THE LAYER STRUCTURE

FIELD OF THE INVENTION

The invention relates to an optoelectronic component with an adjustable property and a method for producing an optoelectronic semiconductor component.

BACKGROUND OF THE INVENTION

Optoelectronic components, e.g. with a planar optical waveguide structure, comprising buffer layer, core layer and covering or cladding layer, are fixed constituent parts of optical fiber transmission technology.

In this case, it is known that said components comprising different layers are constructed successively; a layer structure is produced. Typical layer production methods are e.g. PVD, CVD, PECVD, flame hydrolysis. Semiconductor layers, metal layers or $SiO_2$ layers are used as the layers.

In this case, it is in some instances necessary in a targeted manner to incorporate layers having a defined optical refractive index in said layer structure. In the layers in which the refractive index is intended to be changed in a targeted manner, it is necessary to interrupt the layer construction and to introduce a new adapted layer having a changed refractive index either over the whole area or locally by patterning methods. This interrupts the construction of the layer structure and thus costs valuable process time. Moreover, the production difficulties increase with every layer that is additionally required.

SUMMARY OF THE INVENTION

The present invention is based on the object of providing an optoelectronic component with a layer structure, in which the optical properties of at least one layer, in particular of an optical waveguide, can be changed by means of a simple method step.

This object is achieved according to the invention by means of an optoelectronic component having the features of claim 1, in that at least one irradiation-sensitive structure is arranged in the layer structure, the refractive index of the irradiation-sensitive structure being able to be permanently altered in a manner dependent on an irradiation. The refractive index of the irradiation-sensitive structure can be altered by an irradiation even if the entire layer structure has already been produced, i.e. an interruption of the construction for the targeted introduction of a layer having a different refractive index is not necessary.

In an advantageous refinement of the invention, the layer structure (in which the irradiation-sensitive structure is embedded) comprises $SiO_2$, $SiO_2$—$B_2O_3$ and/or $SiO_2$—$B_2O_3$—$P_2O_5$ or has proportions of at least one of said substances.

In this case, it is advantageous if the irradiation-sensitive structure has a doping made of germanium oxide. Furthermore, it is advantageous if the irradiation-sensitive structure has a doping made of hydrogen. As an alternative, it is advantageous if the irradiation-sensitive structure has
a) germanium oxide and hydrogen,
b) tin oxide,
c) tin oxide and germanium oxide,
d) germanium oxide as doping. These dopings make it possible to alter the refractive index of the structure in a targeted manner and permanently by means of an irradiation.

In this case, it is advantageous if the irradiation-sensitive structure is arranged in a core layer of a waveguide structure. It is also possible to arrange the irradiation-sensitive structure in a buffer layer or a covering layer of a waveguide structure. Different components can be constructed depending on the vertical positioning of the irradiation-sensitive structure.

The irradiation-sensitive structure is advantageously arranged over the whole area in a layer or locally in a layer, in particular as a grating structure. A grating structure may be used e.g. for a laser diode.

It is an advantage if the optoelectronic component according to the invention is designed as a vertical coupler or as a laser diode.

The irradiation-sensitive structure is advantageously part of a layer structure comprising $SiO_2$ layers with different layer dopings.

The object is also achieved by means of a method in which
a) an irradiation-sensitive structure is applied to a layer of a layer structure or to a substrate and afterward
b) a radiation is radiated onto the irradiation-sensitive structure in order to alter the refractive index of the irradiation-sensitive structure in a targeted manner.

The irradiation is advantageously an electromagnetic radiation, in particular UV light in the wavelength range of between 190 and 250 nm. It is also possible for the irradiation to have a particle radiation, in particular an ion radiation, electron radiation or neutron radiation.

For the further construction of the optoelectronic component, in an advantageous manner, after the irradiation, at least one layer is arranged above the irradiation-sensitive structure.

BRIEF DESCRIPTION OF THE DRAWINGS

The invention is explained in more detail below using a plurality of exemplary embodiments with reference to the figures of the drawings, in which.

DESCRIPTION OF THE INVENTION

Figure 1A:
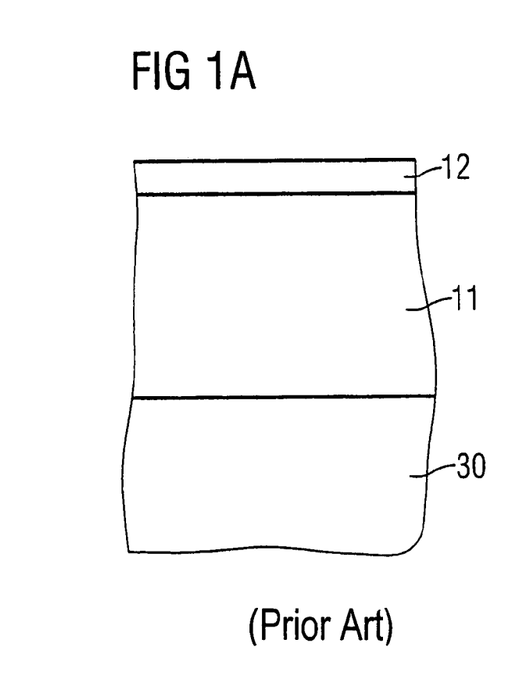
FIGS. 1A to 1C show diagrammatic sectional views of a layer structure of an optoelectronic semiconductor component according to the prior art.
Figure 1B:
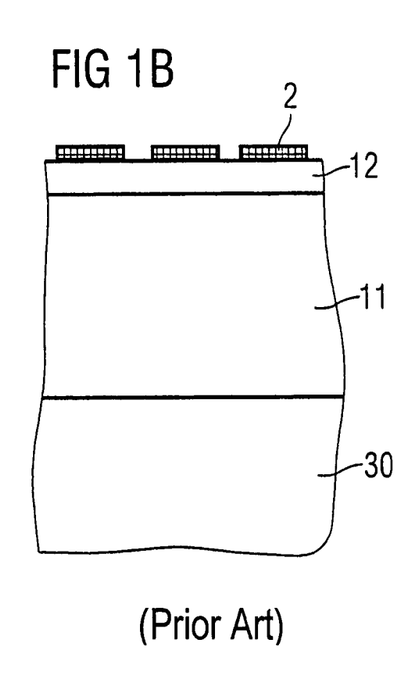
Figure 1C:
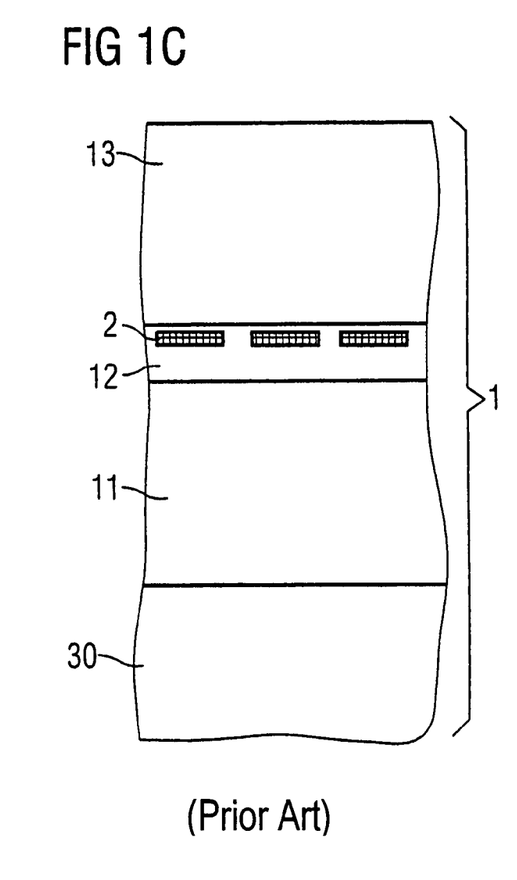

FIGS. 1A to 1C are used to illustrate how layer structures 1 of optoelectronic components according to the prior art are constructed. Optoelectronic components with layer structures, such as e.g. laser diodes, photodiodes or optocouplers, are known per se, so that only the layer structures of the optoelectronic components are represented here for illustration purposes.

In this case, the known construction of a waveguide structure of an optoelectronic component is illustrated here as an example. The construction begins with a buffer layer 11 and a core layer 12 on a substrate 30 (FIG. 1A), afterward a layer having a changed refractive index 2 is arranged on or in the core layer 12 (FIG. 1B). The core layer 12 is then constructed further and then terminated by the covering layer 13 (FIG. 1C).

The respective layers 2, 11, 12, 13 are applied by different methods: semiconductor layers are deposited epitaxially and doped $SiO_2$/Si layers are deposited by means of flame hydrolysis or PECVD.

In the layer in which the intention is to achieve a change in the refractive index, it is necessary, in accordance with the prior art, to interrupt the growth or the deposition (FIG. 1A), to introduce a new adapted layer having a changed refractive index either over the whole area or locally by patterning methods, and afterward to continue the original growth or deposition (see FIGS. 1B and 1C).

In this case, what is disadvantageous, in particular, is that the deposition or growth process has to be interrupted. It is also necessary to deposit an additional layer 2 in order to influence the refractive index. Moreover, the overgrowth of this locally patterned additional layer 2 is not without problems.

Figure 2A:
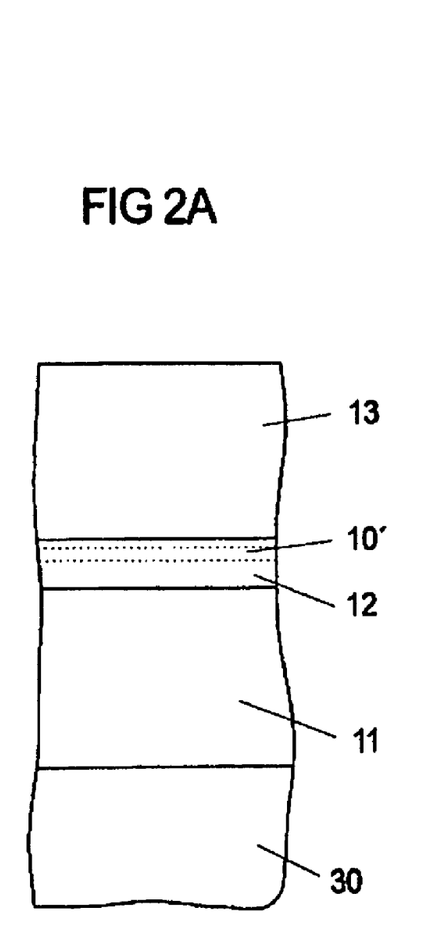
FIGS. 2A and 2B show diagrammatic sectional views of one embodiment of an optoelectronic semiconductor component according to the invention.
Figure 2B:
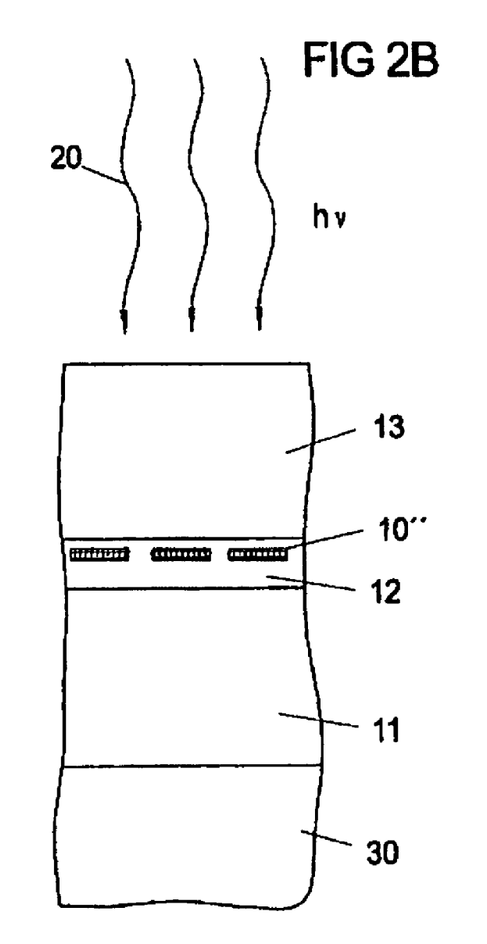

FIGS. 2A and 2B illustrate one embodiment of the optoelectronic component according to the invention and the production thereof, which avoids these disadvantages.

An optoelectronic component according to the invention has an irradiation-sensitive structure 10' (the index "'" designates an irradiation-sensitive structure before an irradiation), with which the refractive index can be altered in a targeted manner, e.g. after the application of the layers.

Here, too, a waveguide structure is chosen as an example, it also being possible, in principle, to use an irradiation-sensitive structure 10' in other optoelectronic semiconductor components, e.g. a laser diode.

FIG. 2A illustrates that firstly all the layers 10', 11, 12, 13 are applied or deposited successively without interruption either epitaxially or by means of flame hydrolysis or PECVD. In principle, further methods, such as PVD or CVD, are also possible.

At the place where the layer region having the changed refractive index is subsequently intended to be produced, an irradiation-sensitive structure 10' is deposited in this case (here in the core layer 12 of the waveguide structure). This irradiation-sensitive structure 10' may be arranged over the whole area in a plane or only locally.

The difference with respect to the adjacent layers (buffer layer 11, covering layer 13, core layer 12) is that the latter are in contrast not irradiation-sensitive.

This is achieved, as illustrated in FIG. 2B, in that the irradiation-sensitive structure 10" ("''" denotes irradiation-sensitive structure after the irradiation) contains at least one additional suitable dopant which reacts to a targeted irradiation. Without irradiation, said dopant has no influence on the refractive index in said structure 10 and the embedding thereof, i.e. the same refractive index as that of the surrounding medium is present.

In the present case, the irradiation-sensitive structure 10' would have the same refractive index as the surrounding core layer 12 before the irradiation 20.

FIG. 2B illustrates that, by means of targeted irradiation 20, the irradiation-sensitive dopant in the irradiation-sensitive structure 10' is excited and the refractive index changes to the new desired value in this layer region. This relationship is described in more detail in FIG. 5.

In this case, it must be ensured that after the irradiation has been switched off, this change in the refractive index remains in the irradiation-sensitive structure 10" and does not revert to the initial value.

This method makes it possible to realize local buried structures in a targeted manner at complete layer sequences. It is also possible to simultaneously monitor the change obtained in the refractive index by means of suitable measurement methods.

In this case, it is possible to alter the refractive index of an entire layer over the whole area, or a local region.

UV light in a wavelength range of between 190 and 250 nm is used here as the irradiation 20. Germanium oxide and hydrogen, which, under UV light, alter their configuration in the core layer 12 and thus change the refractive index in a targeted manner, are used here as the dopant of the irradiation-sensitive structure 10, which is part of a layer structure comprising e.g. $SiO_2$ layers with different layer dopings. As an alternative, germanium oxide and hydrogen alone are also possible as the dopant. Tin oxide and germanium oxide in combination or germanium oxide alone are also possible as dopants.

As an alternative, electromagnetic beams having a different wavelength may also be used. Particle beams, such as e.g. ions or neutrons, are also possible as an alternative or in addition. In this case, it is essential to coordinate the type of irradiation with the dopant in the irradiation-sensitive structure 10.

It is thus possible for all the required layers 11, 12, 13 to be deposited completely without any interruption. The targeted change in the refractive index only takes place afterward.

FIGS. 3A to 3D illustrate four embodiments of a layer structure in which locally irradiation-sensitive structures 10" are arranged in different planes with a changed refractive index after the irradiation, a construction of the layer structure of substrate 30, buffer layer 11, core layer 12 and covering layer 13 being present.

In FIGS. 3A to 3D, the irradiation-sensitive structure 10 is in each case designed as a grating structure.

Figure 3A:
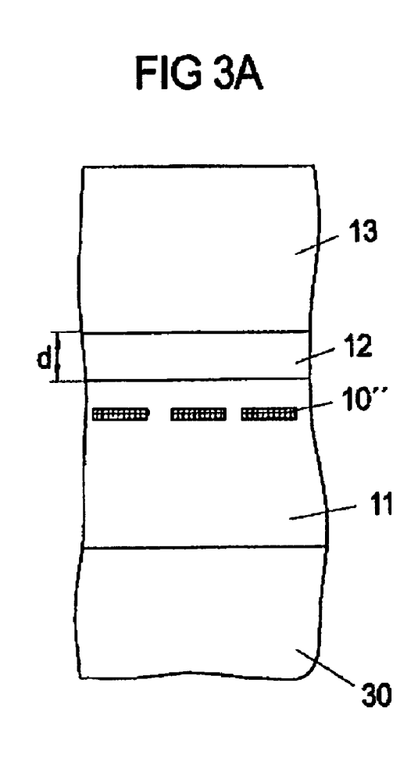
FIGS. 3A to 3D show diagrammatic sectional views of embodiments of an optoelectronic semiconductor component with a different arrangement of an irradiation-sensitive structure.

FIG. 3A shows an arrangement of the irradiation-sensitive structure 10" in the buffer layer 11.

Figure 3B:
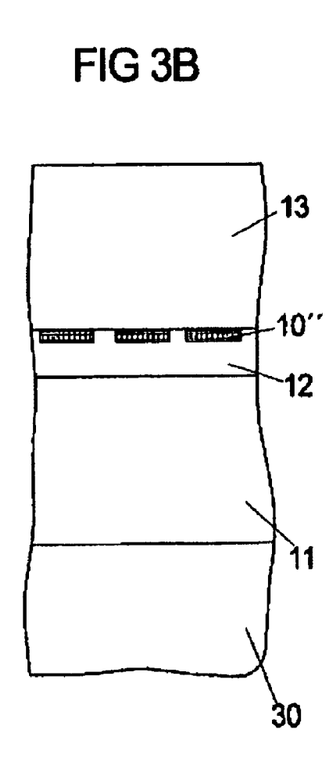
Figure 3C:
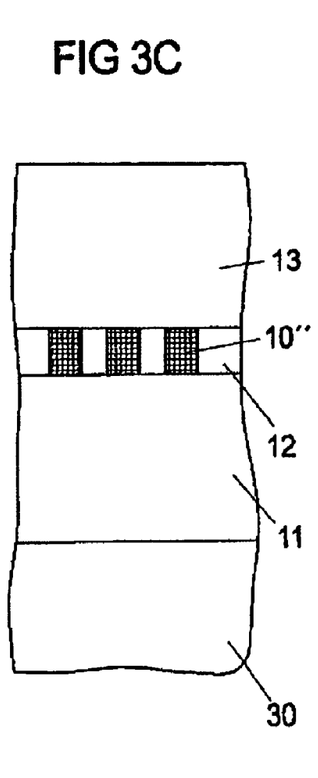
Figure 3D:
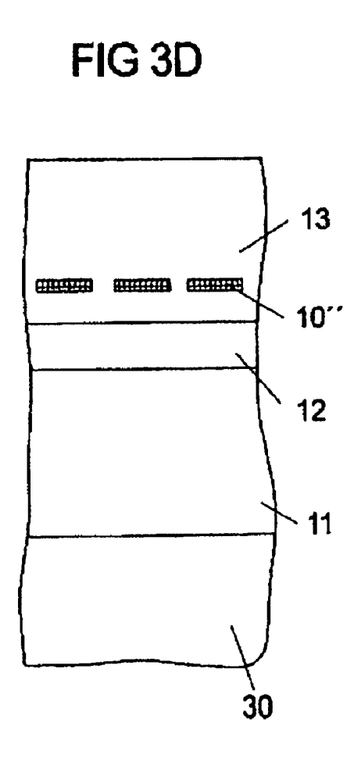

FIG. 3D illustrates an arrangement of the irradiation-sensitive structure 10" in the covering layer 13. The choice of the distance between the irradiation-sensitive structures 10 and the core layer 12 enables a defined overcoupling or crosstalk of light from the core layer 12 into another waveguide (or vice versa).

If these regions, as shown in FIGS. 3B to 3C, are designed in the form of grating structures, then two applications result depending on the dimensioning:

If the grating structure (i.e. the irradiation-sensitive structure 10" after the irradiation) is situated in the upper edge of the core layer 12, then it enables light to be coupled out from the waveguide, e.g. for monitor applications (see T. Erdogan, "Fiber Gratings", Photonics Spectra, January 1998, page 98-97).

If the grating structure (i.e. the irradiation-sensitive structure 10" after the irradiation) extends over the entire vertical thickness d of the core layer 12, then a waveguide selectivity is obtained in the transmission behavior (e.g. Bragg grating, see e.g. R. März: "Integrated Optics: Design and Modelling", Artech House, Boston, 1995, Seiten page 231 et seq).

Figure 4A:
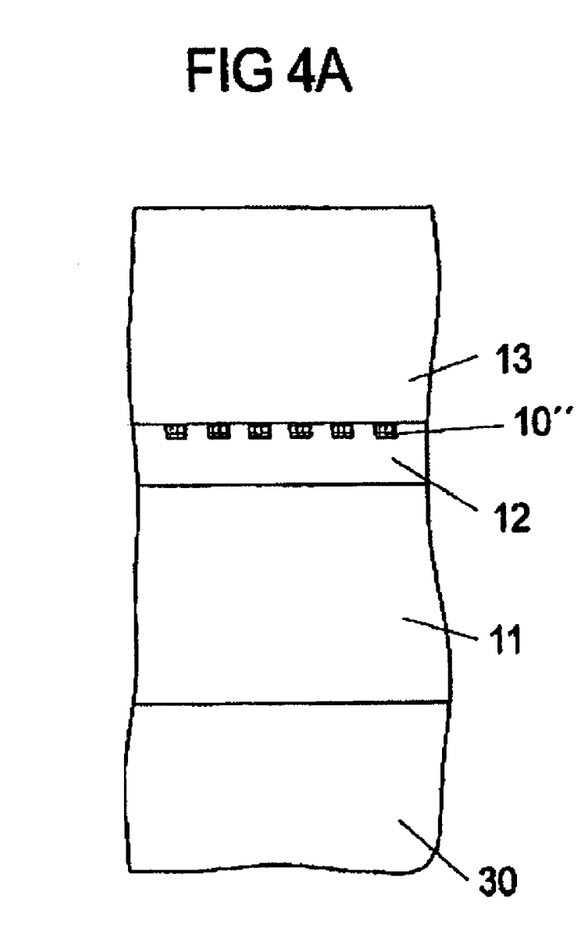
FIGS. 4A and 4B shows diagrammatic sectional views of two further embodiments of optoelectronic semiconductor components according to the invention.
Figure 4B:
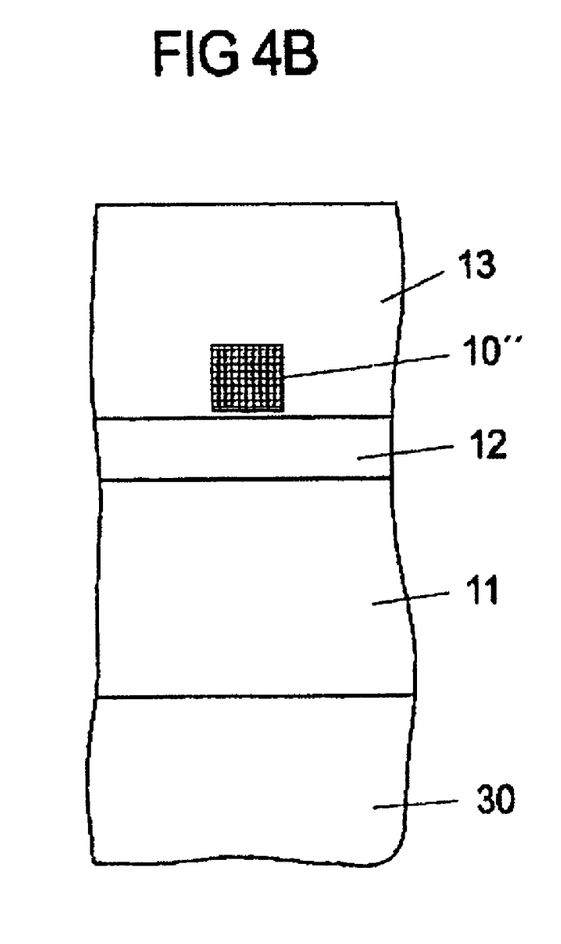

FIGS. 4A and 4B illustrate two further embodiments of optoelectronic components according to the invention. The basic construction of the structure corresponds to that in FIGS. 1, 2 and 3, so that reference may be made to this description.

FIG. 4A shows a planar optical waveguide structure in which part of the light guided in the core layer 12 is coupled out through the introduction of a specially dimensioned local grating structure 10″ in the form of an irradiation-sensitive structure. This coupled-out light may be captured e.g. by a monitor diode provided on the upper edge of the planar waveguide structure (light power measurement).

FIG. 4B illustrates the principle of a vertical coupler. In this case, in the covering layer 13, at a specific distance from the core layer 12, by means of the targeted irradiation, a waveguide is generated in/from an irradiation-sensitive layer 10″, said waveguide usually having the same dimensions and the same refractive index as the core layer 12.

Figure 5:
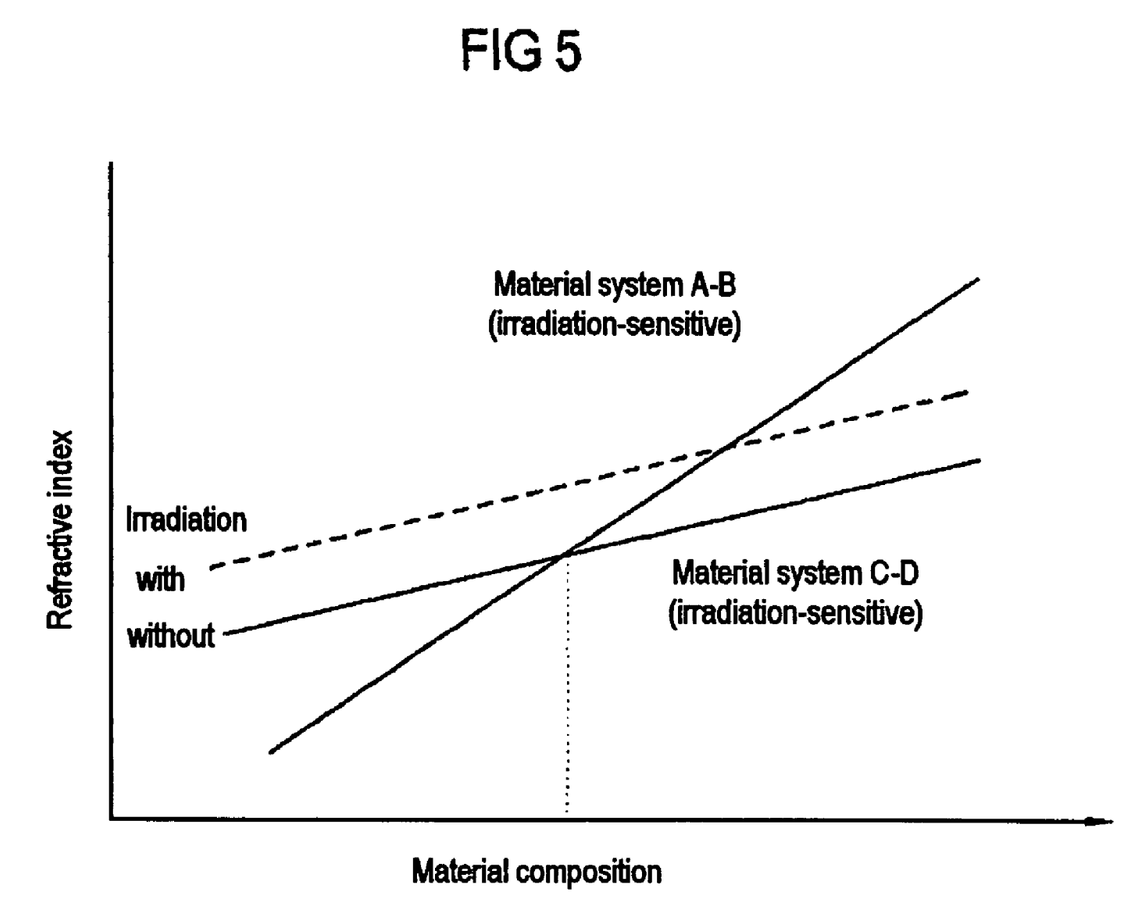
FIG. 5 shows a diagrammatic illustration of a functional relationship between refractive index and material composition with the irradiation as parameters.

FIG. 5 diagrammatically shows the relationship between the refractive index of an irradiation-sensitive structure and the material composition thereof.

As mentioned above, the irradiation-sensitive structure contains an additional suitable "dopant" which reacts to a targeted irradiation. What is important in this case is that said "dopant" has no influence on the refractive index without irradiation in said layer (material system C-D), i.e. the same refractive index as that of the surrounding medium (material A-B) is present. By means of targeted irradiation, the irradiation-sensitive dopant is excited and changes the refractive index to the new desired value in this layer region. In this case, it has to be ensured that, after the irradiation has been switched off, this change in the refractive index remains and does not revert to the initial value.

Appropriate material systems are, inter alia, semiconductors (e.g. Si, InGaAlAs), dielectrics (e.g. $SiO_2$) and plastics (e.g. polymers)

The embodiment of the invention is not restricted to the preferred exemplary embodiments specified above. Rather, a number of variants are conceivable which make use of the optoelectronic semiconductor component according to the invention and the method for producing said component also in the case of embodiments of fundamentally different configuration.

LIST OF REFERENCE SYMBOLS

1 Layer structure
10 Irradiation-sensitive structure (': before the irradiation, ″ after the irradiation)
11 Buffer layer
12 Core layer
13 Covering layer
20 Irradiation
30 Substrate
d Thickness of the core layer

The invention claimed is:

1. An optoelectronic component with a layer structure, the optoelectronic component comprising:
    at least one irradiation-sensitive structure in the layer structure having a first refractive index that is able to be permanently altered by irradiation comprising a particle radiation to a second refractive index, and at least one non-irradiation sensitive layer being arranged above the irradiation-sensitive structure, wherein the layer structure in which the irradiation-sensitive structure is embedded comprises $SiO_2$, $SiO_2$-$B_2O_3$ or $SiO_2$-$B_2O_3$-$P_2O_5$;
    wherein the second refractive index substantially matches a third refractive index of a particular layer in the layer structure and wherein the at least one irradiation-sensitive structure forms part of a vertical coupler such that light couples between the particular layer and the at least one irradiation-sensitive structure.

2. The optoelectronic component of claim 1, wherein the irradiation-sensitive structure comprises a doping made of germanium oxide.

3. The optoelectronic component of claim 1, wherein the irradiation-sensitive structure comprises a doping made of hydrogen.

4. The optoelectronic component of claim 1, wherein the irradiation-sensitive structure comprises a doping, wherein the doping comprises
    a) germanium oxide and hydrogen,
    b) tin oxide,
    c) tin oxide and germanium oxide, or
    d) germanium oxide.

5. The optoelectronic component of claim 1, wherein the irradiation-sensitive structure is arranged in a core layer of a waveguide structure.

6. The optoelectronic component of claim 1, wherein the irradiation-sensitive structure is arranged in a buffer layer or a covering layer of a waveguide structure.

7. The optoelectronic component of claim 1, wherein the irradiation-sensitive structure is arranged over the whole area in a layer or locally in a layer as a grating structure.

8. The optoelectronic component of claim 1, wherein the optoelectronic component is a vertical coupler or a laser diode.

9. The optoelectronic component of claim 1, wherein the irradiation-sensitive structure is part of one of a plurality of $SiO_2$ layers with different layer dopings.

10. A method for producing an optoelectronic semiconductor component, the method comprising:
    a) applying an irradiation-sensitive structure to a layer of a layer structure or to a substrate, wherein the layer or the substrate to which the irradiation-sensitive structure is applied includes one or more of $SiO_2$, $SiO_2$-$B_2O_3$ or $SiO_2$-$B_2O_3$-$P_2O_5$;
    b) irradiating the irradiation-sensitive structure in order to permanently alter a refractive index of the irradiation-sensitive structure in a targeted manner such that the refractive index of the irradiation-sensitive structure is the same as a refractive index of a particular layer of the layer structure; and
    c) depositing a non-irradiation sensitive layer above the irradiation-sensitive structure, wherein the irradiation-sensitive structure forms a vertical coupler with respect to the particular layer.

11. The method of claim 10, wherein irradiation includes particle radiation comprising an ion radiation, an electron radiation, or a neutron radiation.

12. An optoelectronic component, comprising:
    a substrate;
    a buffer layer positioned above the substrate;
    a core layer positioned above the buffer layer;
    a covering layer positioned above the core layer; and
    an irradiation sensitive structure disposed a particular distance from the core layer, wherein a refractive index of the irradiation sensitive structure after irradiation matches a refractive index of the core layer to form a vertical coupler.

13. The optoelectronic component as recited in claim 12, wherein the optoelectronic component comprises a laser diode, wherein the irradiation sensitive structure comprises dimensions that substantially the same dimensions as the core layer and wherein light coupled out is provided to a monitor diode that is used to measure a power of the light.

14. The optoelectronic component as recited in claim 12, wherein the core layer comprises $SiO_2$, $SiO_2$-$B_2O_3$ or $SiO_2$-$B_2O_3$-$P_2O_5$.

15. The optoelectronic component as recited in claim 12, wherein the irradiation-sensitive structure comprises a doping, wherein the doping comprises:
   a) germanium oxide and hydrogen,
   b) tin oxide,
   c) tin oxide and germanium oxide, or
   d) germanium oxide.

16. The optoelectronic component as recited in claim 12, wherein the irradiation-sensitive structure is sensitive to at least one of: ion radiation; electron radiation; and neutron radiation.

17. The optoelectronic component as recited in claim 12, wherein the irradiation-sensitive structure comprises a grating.

* * * * *

UNITED STATES PATENT AND TRADEMARK OFFICE
CERTIFICATE OF CORRECTION

PATENT NO. : 7,376,294 B2  Page 1 of 1
APPLICATION NO. : 10/741745
DATED : May 20, 2008
INVENTOR(S) : Albrecht et al.

It is certified that error appears in the above-identified patent and that said Letters Patent is hereby corrected as shown below:

On the Title Page
Item 75, Inventors, change "Helmut Albarecht" to --Helmut Albrecht--

Column 3
Line 57, change "structure 10" to --structure 10'--

Column 4
Line 17, change "structure 10," to --structure 10",--
Line 28, change "structure 10." to --structure 10".--
Line 39, change "structure 10" to --structure 10"--
Line 47, change "structure 10" to --structure 10"--

Signed and Sealed this

Fourteenth Day of September, 2010

David J. Kappos
*Director of the United States Patent and Trademark Office*